United States Patent
Cho et al.

(10) Patent No.: US 7,447,092 B2
(45) Date of Patent: **\*Nov. 4, 2008**

(54) WRITE DRIVER CIRCUIT FOR CONTROLLING A WRITE CURRENT APPLIED TO A PHASE CHANGE MEMORY BASED ON AN AMBIENT TEMPERATURE

(75) Inventors: Baek-Hyung Cho, Osan-si (KR); Woo-Yeong Cho, Hwaseong-si (KR); Hyung-Rok Oh, Seongnam-si (KR); Byung-Gil Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/079,198

(22) Filed: Mar. 15, 2005

(65) Prior Publication Data

US 2005/0162303 A1 Jul. 28, 2005

Related U.S. Application Data

(63) Continuation of application No. 10/921,797, filed on Aug. 20, 2004, now Pat. No. 6,885,602.

(30) Foreign Application Priority Data

Aug. 22, 2003 (KR) .............................. 2003-58247

(51) Int. Cl.
*G11C 7/04* (2006.01)

(52) U.S. Cl. .................. 365/212; 365/211; 365/163; 365/225.7; 365/148; 365/230.06

(58) Field of Classification Search ............... 365/163, 365/225.7, 148, 211, 212, 230.06
See application file for complete search history.

(56) References Cited

U.S. PATENT DOCUMENTS

| | | | |
|---|---|---|---|
| 3,271,591 A | 9/1966 | Ovshinsky | 327/500 |
| 3,699,543 A | 10/1972 | Neale | 365/163 |
| 3,846,767 A | 11/1974 | Cohen | 327/198 |
| 3,922,648 A | 11/1975 | Buckley | 365/163 |
| 6,282,216 B1 | 8/2001 | Ikeuchi et al. | 372/29.015 |
| 6,339,350 B1 | 1/2002 | Tanaka | 327/148 |
| 6,885,602 B2 * | 4/2005 | Cho et al. | 365/211 |
| 7,012,834 B2 * | 3/2006 | Cho et al. | 365/163 |
| 2006/0028886 A1 * | 2/2006 | Choi et al. | 365/202 |
| 2006/0109707 A1 * | 5/2006 | Happ et al. | 365/163 |

* cited by examiner

*Primary Examiner*—Andrew Q Tran
(74) *Attorney, Agent, or Firm*—Harness, Dickey & Pierce P.L.C.

(57) ABSTRACT

A programming method which controls the amount of a write current applied TO Phase-change Random Access Memory (PRAM), and a write driver circuit realizing the programming method. The programming method includes maintaining a ratio of a resistance of the PCM in the higher resistance state to a resistance of the phase change material (PCM) in the lower resistance state constant or substantially constant independent of an ambient temperature. The ratio may be maintained by increasing, decreasing or keeping the same a reset current and/or a set current.

11 Claims, 7 Drawing Sheets

WRITE DRIVER CIRCUIT FOR CONTROLLING A WRITE CURRENT APPLIED TO A PHASE CHANGE MEMORY BASED ON AN AMBIENT TEMPERATURE

PRIORITY STATEMENT

This application is a continuation of U.S. application Ser. No. 10/921,797, filed on Aug. 20, 2004 now U.S. Pat. No. 6,885,602, which further claims priority of Korean Patent Application No. 2003-58247 filed on Aug, 22, 2003, in Korean Intellectual Property Office, the disclosure of both of which are incorporated herein in their entirety by reference.

BACKGROUND OF THE INVENTION

1. Field of the Invention

The present invention relates to a phase change memory device, and more particularly, to a programming method of controlling a write current applied to a phase change memory device according to the ambient temperature and a write driver circuit realizing the programming method.

2. Description of the Related Art

A Phase-change Random Access Memory (PRAM) is a non-volatile memory device that stores data using a Phase Change Material (PCM), such as Ge—Sb—Te (GST), whose phase and resistance change according to the ambient temperature.

Information may be stored in the PRAM when the GST changes into a crystalline phase or an amorphous phase according to the ambient temperature and/or the heating time. A high temperature, e.g., 900° C. or more, may applied to the PCM so as to change the phase of the PCM. The high temperature may be obtained from joule heating, generated from current flowing through a cell of the PRAM.

In a write operation, when a current is applied to the PCM to generate a temperature greater than or equal to its melting temperature and then the PCM is rapidly cooled down, the PCM becomes amorphous and data '1' may be recorded in the PCM. In this case, the PCM is said to have entered a "reset" state.

If the PCM is heated at a temperature greater than or equal to a crystallization temperature, maintained for a given time, and cooled down, the PCM becomes crystalline and data '0' may be recorded in the PCM. In this case, the PCM is said to have entered a "set" state.

In a read operation, a bit line and a word line may be selected to choose a particular memory cell. When an external current is applied to the PCM, a resistance of the PCM changes. When the resistance of the PCM changes, a voltage changes, thus allowing the expression of binary values '1' and '0'.

In a PRAM cell, the write operation may be affected by the ambient temperature, since both the amount of a write current and a dynamic resistance of the PCM may change according to the ambient temperature.

In general, the higher the ambient temperature, the lower the performance of a transistor that drives the write current. As the transistor deteriorates, the amount of the write current and the dynamic resistance of the PCM also decrease.

Accordingly, thermal energy, i.e., temperature, which is generated from joule heating and is a direct cause of the phase change of the PCM cell, decreases, thus changing the GST into an unstable crystalline or amorphous state. Thus, the difference between a reset resistance and a set resistance becomes smaller and may cause errors during a read operation.

FIG. 1 illustrates a variation in a reset resistance R_RESET or a set resistance R_SET according to the ambient temperature. Referring to FIG. 1, a ratio of the reset resistance R_RESET to the set resistance R_SET decreases as the ambient temperature increases. The ratio may decrease because the PCM does not reach a crystallization temperature or an amorphization temperature as the ambient temperature becomes higher during the write operation.

Thus, as the ambient temperature becomes higher, a sensing margin between the reset state and the set state become smaller, thus causing possible malfunction of a PRAM.

FIG. 2A illustrates a variation in the write current according to the ambient temperature and FIG. 2B illustrates a variation in energy in the PCM according to the ambient temperature.

Referring to FIG. 2A, the higher the ambient temperature, the worse the performances of the driver transistors, namely, the smaller the write current applied to the PRAM cell.

In FIG. 2B, the energy denotes thermal energy that is generated from the joule heating. The thermal energy generated from the joule heating may be proportional to the square of a current flowing through the PRAM cell and a resistance of the PCM. The higher the ambient temperature, the smaller the current flowing through the PRAM cell, and the lower the resistance of the PCM. As shown, the thermal energy in the PRAM cell decreases as the ambient temperature increases.

When the PCM enters the reset state, the PCM is heated to a temperature greater than or equal to the melting temperature Tm and then changes into an amorphous phase. However, if the ambient temperature exceeds a given temperature, a reset current may not reach a desired reset current range and the temperature applied to the PRAM cell may be lower than the melting temperature, thus changing the PCM into an unstable amorphous state.

Likewise, if a set current does not fall within a desired set current range, the temperature applied to the PRAM cell may not reach a crystallization temperature Tc, thus changing the PCM into an unstable crystalline state.

As a result, when the temperature applied to the PCM is lower than the melting temperature Tm, the PCM does not completely change into the amorphous state. When the temperature applied to the PCM is lower than the crystallization temperature Tc, the PCM does not completely change into the crystalline state. In both cases, both the reset resistance and the set resistance are lowered during the read operation, which may cause an operation error, where the reset state may be erroneously detected as the set state.

SUMMARY OF THE INVENTION

Example embodiments of the present invention provides a programming method which controls a write current applied to a Phase-change Random Access Memory (PRAM) according to the ambient temperature.

Example embodiments of the present invention also provides a write driver circuit which controls a write current applied to a PRAM cell according to the ambient temperature.

An example embodiment of the present invention is directed to a programming method used in a phase-change random access memory (PRAM) which uses a phase change material (PCM) that changes into a higher resistance state or a lower resistance state in response to a current pulse, including increasing the amount of a reset current when changing the PCM into the higher resistance state and the amount of a set current when changing the PCM into the lower resistance state when the ambient temperature increases.

In an example embodiment of the present invention, the amounts of the reset current and the set current are increased when the ambient temperature increases, so as to keep a ratio of a resistance of the PCM in the higher resistance state to a resistance of the PCM in the lower resistance state constant regardless of the ambient temperature.

In an example embodiment of the present invention, the amount of the reset current is increased to an amount within a range in which the PCM changes into the higher resistance state and the amount of the set current is increased to an amount within a range in which the PCM changes into the lower resistance state.

Another example embodiment of the present invention is directed to a programming method used in a PRAM which uses a PCM that changes into a higher resistance state or a lower resistance state in response to a current pulse, including increasing the amount of a reset current when the ambient temperature increases, so as to change the PCM into the higher resistance state.

In an example embodiment of the present invention, the programming method may further include reducing the amount of a set current when the ambient temperature increases, so as to change the PCM into the lower resistance state.

In an example embodiment of the present invention, the amount of the set current is reduced to an amount within a range in which the PCM changes into the lower resistance state.

In an example embodiment of the present invention, when the ambient temperature increases, the amount of the reset current increases and the amount of the set current decreases so as to increase a ratio of a resistance of the PCM in the higher resistance state to a resistance of the PCM in the lower resistance state.

Another example embodiment of the present invention is directed to a write driver circuit included in a PRAM which uses a PCM that changes into a higher resistance state or a lower resistance state in response to a current pulse. The write driver circuit may include a current controller unit which controls generation of a reset current or a set current in response to a write active signal, and data or inversed data; and a current driver unit which is controlled by the current controller to generate the reset current or the set current and changes the amount of the reset current or the set current in response to a positive control signal.

In an example embodiment of the present invention, the positive control signal is a voltage signal whose voltage level increases when the ambient temperature increases. In an example embodiment of the present invention, the current driver unit may include a current mirror unit which outputs the reset current or the set current and a positive controller which increases the amount of the reset current or the set current in response to the positive control signal.

In an example embodiment of the present invention, the current mirror unit may include a first transistor having a first terminal connected to a line voltage, and a gate and a second terminal which are connected to a first node; and a second transistor having a first terminal connected to the line voltage, a gate connected to the first node, and a second terminal which outputs the reset current or the set current.

In an example embodiment of the present invention, the current controller unit may include a third transistor having a first terminal connected to the first node, a gate to which the data is applied, and a second terminal connected to a second node; a fourth transistor having a first terminal connected to the first node, a gate to which the inversed data is applied, and a second terminal connected to the second node; and a fifth transistor having a first terminal connected to the second node, a gate to which the write active signal is applied, and a second terminal connected to a ground voltage.

In an example embodiment of the present invention, the positive controller may be a sixth transistor having a first terminal connected to the first node, a gate to which the positive control signal is applied, and the second terminal connected to the second node.

In an example embodiment of the present invention, the current driver unit may further include a seventh transistor having a first terminal connected to the first node, a gate to which a negative control signal is applied, and a second terminal connected to the second node.

In an example embodiment of the present invention, the negative control signal may be a voltage signal whose voltage level decreases when the ambient temperature increases.

In an example embodiment of the present invention, the write driver circuit may further include a thermal compensator which generates the positive control signal and the negative control signal according to the ambient temperature. In an example embodiment of the present invention, the thermal compensator may include a band gap reference circuit.

Another example embodiment of the present invention is directed to a programming method used in a PRAM which uses a PCM that changes into a higher resistance state or a lower resistance state in response to a current pulse, including maintaining a ratio of a resistance of the PCM in the higher resistance state to a resistance of the PCM in the lower resistance state constant or substantially constant independent of an ambient temperature.

In an example embodiment of the present invention, the ratio may be maintained by increasing, decreasing, or keeping the same a reset current and/or a set current.

BRIEF DESCRIPTION OF THE DRAWINGS

The present invention will become more apparent by describing in detail exemplary embodiments thereof with reference to the attached drawings in which.

DETAILED DESCRIPTION OF EXEMPLARY EMBODIMENTS OF THE INVENTION

Figure 1:
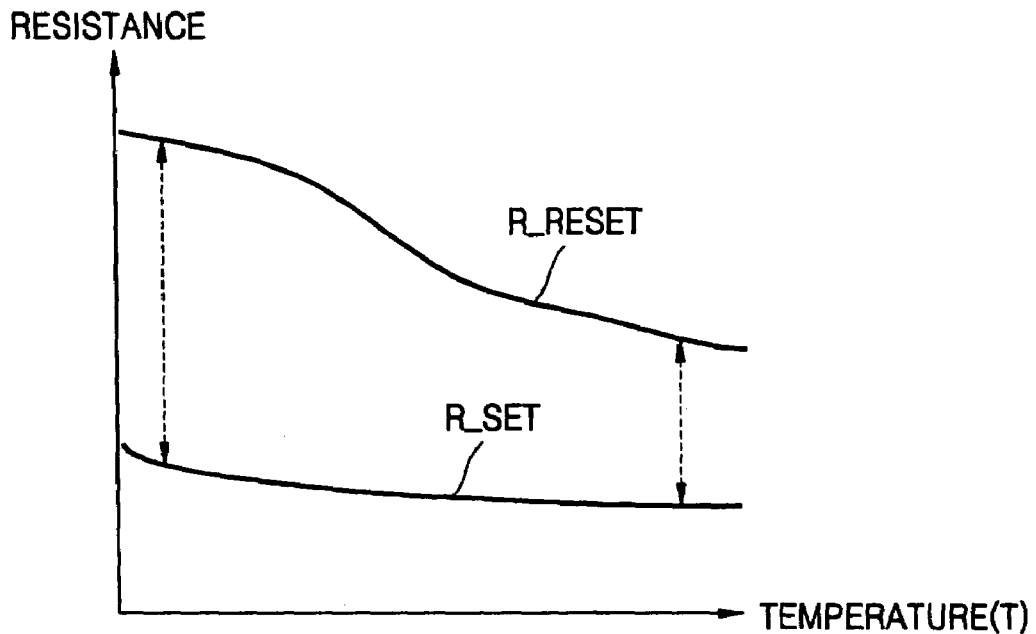
FIG. 1 is a graph illustrating variations in a reset resistance and a set resistance according to the ambient temperature.

Hereinafter, exemplary embodiments of the present invention will be described in a greater detail with reference to the accompanying drawings. The same reference numerals represent the same elements throughout the drawings.

A programming method according to an exemplary embodiment of the present invention, which may be used in a Phase-change Random Access Memory (PRAM), may include increasing the amount of a reset current to change a Phase Change Material (PCM) into a higher resistance state and/or increasing the amount of a set current to change the PCM into a lower resistance state when the ambient temperature increases.

In other words, in the PRAM cell according to an embodiment of the present invention, the amount of the set current and/or the reset current may be increased when the ambient temperature increases. The amount of the reset current and/or the set current may be increased such that a ratio of a resistance of the PRAM in the higher resistance state to that of a resistance in the lower resistance state is maintained regardless of the ambient temperature.

There are several ways to increase the amount of current. For instance, a write current may be controlled whenever the ambient temperature increases, using a circuit that senses an increase in the ambient temperature. An example of controlling the write current will be described below in more detail.

In an example embodiment, the amount of reset current may be increased to an amount that lies within a desired range in which the PCM changes into a higher resistance state, and/or that of the set current may be increased to an amount that lies within a desired range in which the PCM changes into a lower resistance state.

Figure 3:
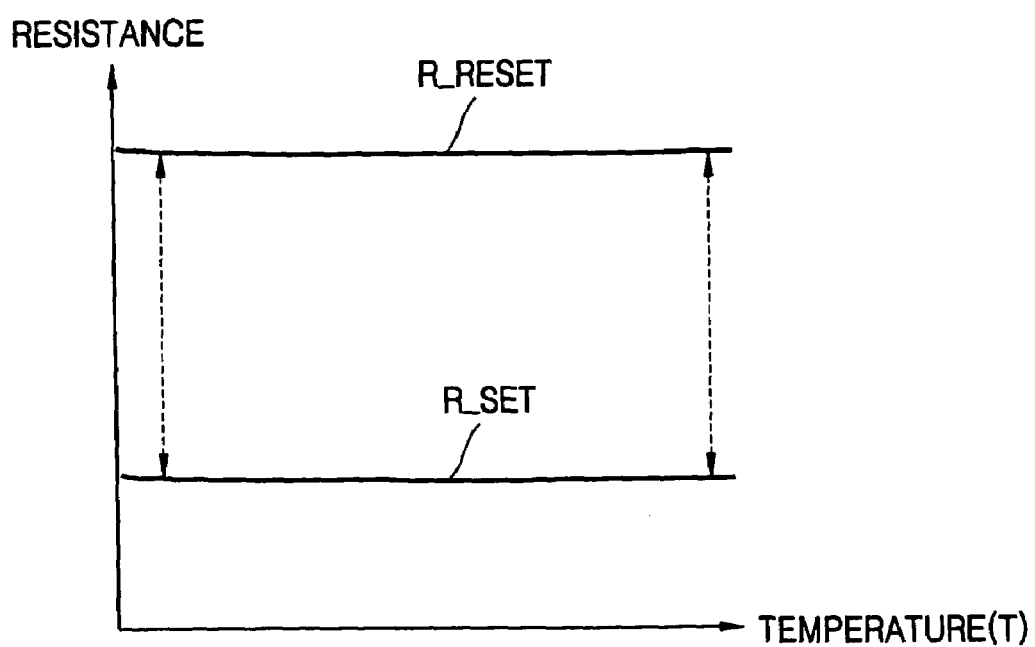
FIG. 3 is a graph illustrating variations in the reset resistance and the set resistance according to the ambient temperature when using a programming method according to an exemplary embodiment of the present invention.

FIG. 3 is a graph illustrating variations in a reset resistance R_RESET and a set resistance R_SET according to the ambient temperature when using a programming method according to an exemplary embodiment of the present invention. Referring to FIG. 3, a ratio of the reset resistance R_RESET and the set resistance R_SET may be maintained regardless of the ambient temperature. Thus, during a read operation, it is possible to achieve a more stable sensing operation irrespective of the ambient temperature and/or reduce or prevent the occurrence of an error in the read operation.

Figure 4A:
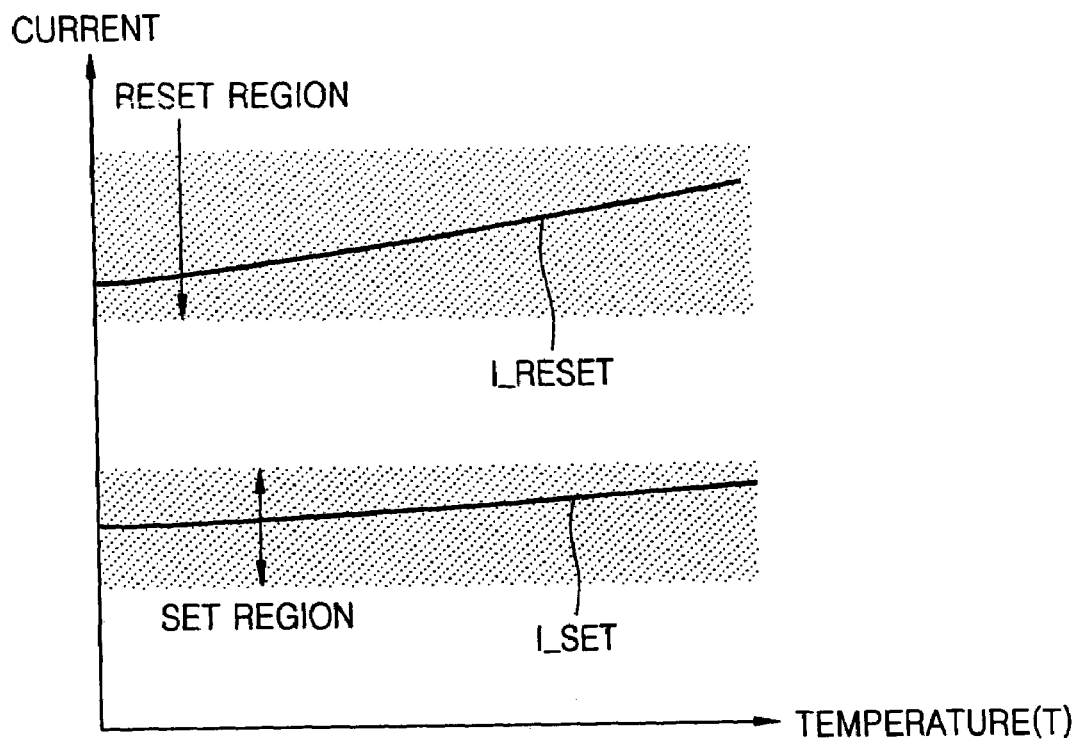
FIG. 4A is a graph illustrating variations in the write currents according to the ambient temperature when using a programming method according to an exemplary embodiment of the present invention.
Figure 4B:
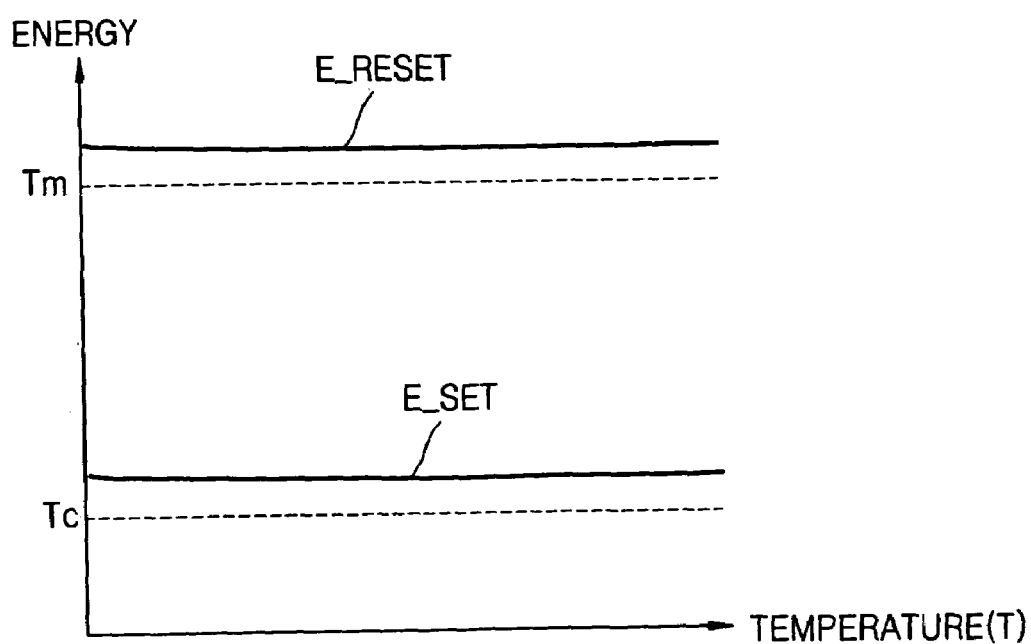
FIG. 4B is a graph illustrating variations in energy in the PCM according to the ambient temperature when using a programming method according to an exemplary embodiment of the present invention.

FIG. 4A is a graph illustrating variations in the write currents according to the ambient temperature when using the programming method according to an exemplary embodiment of the present invention. FIG. 4B is a graph illustrating a variation of energy in the PCM according to the ambient temperature when using the programming method according to an exemplary embodiment of the present invention.

In the programming method according to an exemplary embodiment, the amounts of the reset current I_RESET and/or the set current I_SET are increased when the ambient temperature increases. As a result, thermal energy applied to the PRAM cell can be maintained regardless of the ambient temperature, as shown in FIG. 4B.

Figure 5A:
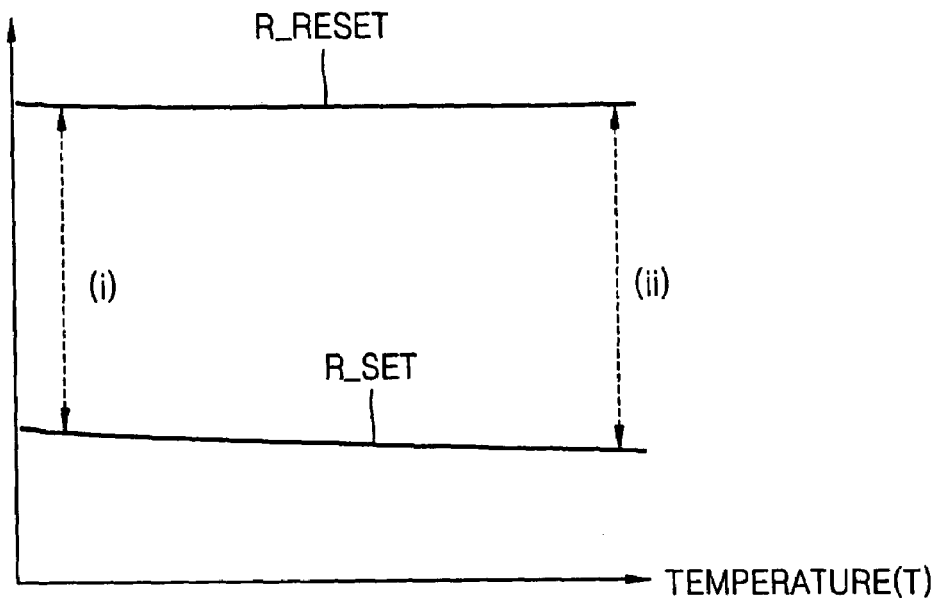
FIG. 5A is a graph illustrating variations in the reset resistance and the set resistance according to the ambient temperature when using a programming method according to an embodiment of the present invention.
Figure 5B:
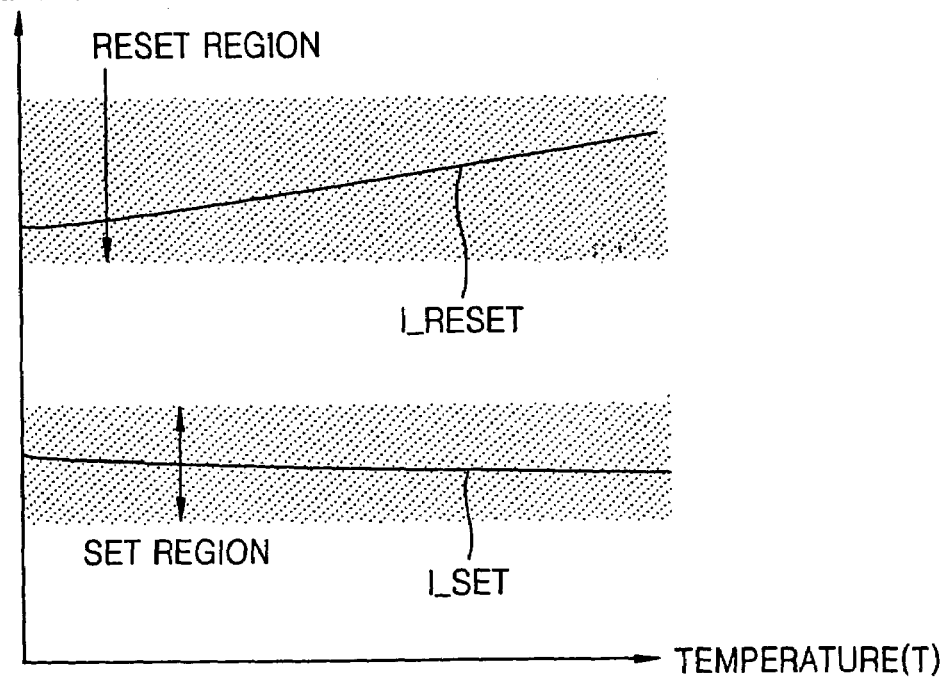
FIG. 5B is a graph illustrating variations in the write current according to the ambient temperature when using a programming method according to an exemplary embodiment of the present invention.

FIG. 5A is a graph illustrating variations in the reset resistance R_RESET and the set resistance R_SET according to the ambient temperature when using a programming method according to another exemplary embodiment of the present invention. FIG. 5B is a graph illustrating variations in write currents according to the ambient temperature when using a programming method according to another exemplary embodiment of the present invention.

Referring to FIG. 5B, the amount of the reset current I_RESET may be increased when the ambient temperature increases, thereby maintaining the reset resistance R_RESET regardless of the ambient temperature.

The amount of the set current I_SET may be reduced when the ambient temperature becomes higher, thus causing a reduction in the set resistance R_SET. As a result, a ratio of the reset resistance R_RESET to the set resistance R_SET may be increased as the ambient temperature becomes higher, thereby improving a sensing margin during a read operation. An increase in the ratio is illustrated by (i) and (ii) of FIG. 5A.

As shown in FIG. 5B, the amount of the set current I_SET may be reduced to an amount that still lies within a desired range in which the PCM can change into the lower resistance state.

If the amount of the set current I_SET does not fall within the range, the PCM does not change into the crystallization state, and therefore, an amount of the set current I_SET may be reduced within the desired range when the ambient temperature increases.

As described above, in exemplary embodiments of the present invention, the ratio of the reset current I_RESET and set current I_SET may be maintained when the ambient temperature increases by increasing, decreasing, or keeping the same the amounts of the reset current I_RESET and/or the set current I_SET.

Figure 6:
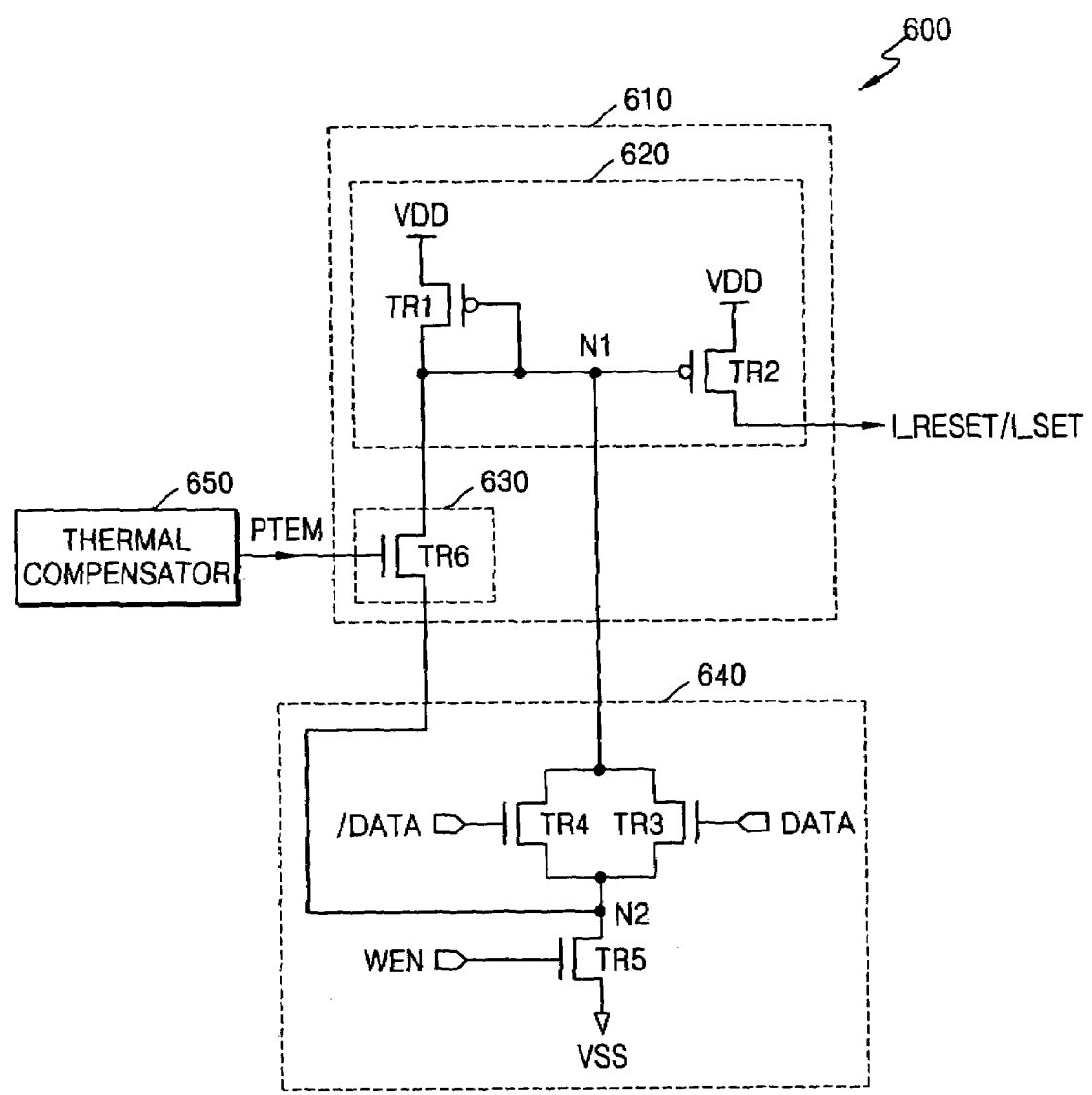
FIG. 6 is a circuit diagram of a write driver circuit that can implement a programming method according to an exemplary embodiment of the present invention.

FIG. 6 is a circuit diagram of a write driver circuit 600 that can implement a programming method according to exemplary embodiments of the present invention. Referring to FIG. 6, the write driver circuit 600 may include a current driver unit 610 and a current controller unit 640.

The current controller unit 640 may control generation of the reset current I_RESET or the set current I_SET in response to a write active signal WEN, and data DATA or reversed data/DATA. The current driver unit 610 may be controlled by the current controller unit 640 to generate the reset current I_RESET and/or the set current I_SET, and changes the amount of the reset current I_RESET or the set current I_SET in response to a control signal, such as positive control signal PTEM.

Figure 7:
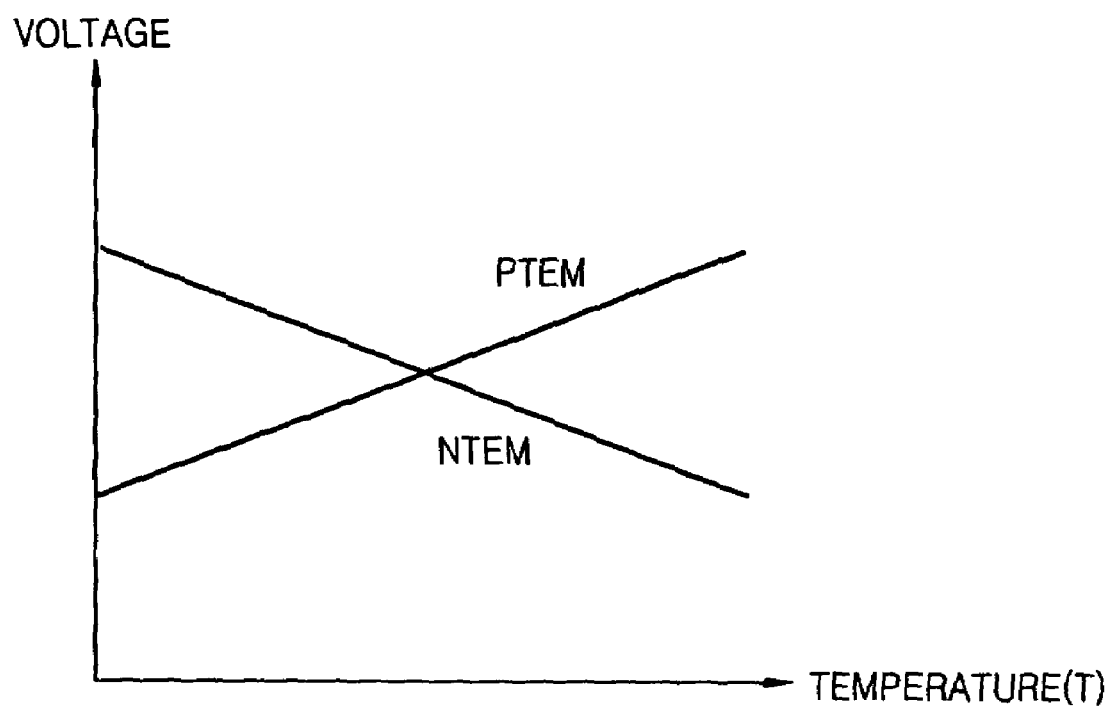
FIG. 7 is a graph illustrating a positive control signal and a negative control signal according to exemplary embodiments of the present invention.

FIG. 7 is a graph illustrating the positive control signal PTEM and a negative control signal NTEM. The positive control signal PTEM may be a voltage signal whose voltage level increases when the ambient temperature increases.

Hereinafter, the operation of a write drive circuit according to another exemplary embodiment of the present invention will be described with reference to FIGS. 6 and 7. The current driver unit 610 may include a current mirror unit 620 and a positive controller 630. The current mirror unit 620 may output the reset current I_RESET or the set current I_SET.

More specifically, the current mirror unit 620 may include a first transistor TR1 and a second transistor TR2. The first transistor TR1 may have a first terminal connected to a line voltage VDD, and a second terminal and a gate that are connected to a first node N1. The second transistor TR2 may have a first terminal connected to the line voltage VDD and a gate connected to the first node N1. Also, the second transistor TR2 may output the reset current I_RESET or the current I_SET.

The current controller unit 640 may include a third transistor TR3, a fourth transistor TR4, and a fifth transistor TR5. The third transistor TR3 may have a first terminal connected to the first node N1, a gate to which the data DATA is applied, and a second terminal connected to a second node N2. The fourth transistor TR4 may have a first terminal connected to the first node N1, a gate to which the reversed data/DATA is applied, and a second terminal connected to the second node N2. The fifth transistor TR5 may have a first terminal connected to the second node N2, a gate to which the write active signal WEN is applied, and a second terminal connected to a ground voltage VSS.

The third transistor TR3 may be larger than the fourth transistor TR4. Thus, when the third and fifth transistors TR3 and TR5 are turned on, a voltage level of the first node N1 may be lower than when the fourth and fifth transistors TR4 and TR5 are turned on.

When the write active signal WEN is applied at a first level (for example, a "high" level) to the gate of the fifth transistor TR5, the current controller unit 640 starts to operate. The level of the write active signal WEN applied need not be limited, that is, the current controller unit 640 may be set to operate in response to the write active signal WEN at a low level.

Assuming the data DATA and the reversed data /DATA are applied at a first (high) level and a second (low) level so as to write data '1' to a PRAM cell (not shown), i.e., the PRAM cell enters a reset state. In this case, the third transistor TR3 may be turned on, but the fourth transistor TR4 may be turned off.

When the third and fifth transistors TR3 and TR5 are turned on, a voltage level of the first node N1 may decrease, and as a result, the first and second transistors TR1 and TR2 may be turned on. Since the first and second transistors TR1 and TR2 form a current mirror, the amount of current output from the second terminal of the second transistor TR2 depends on a ratio of the first transistor TR1 to the second transistor TR2.

Figure 2A:
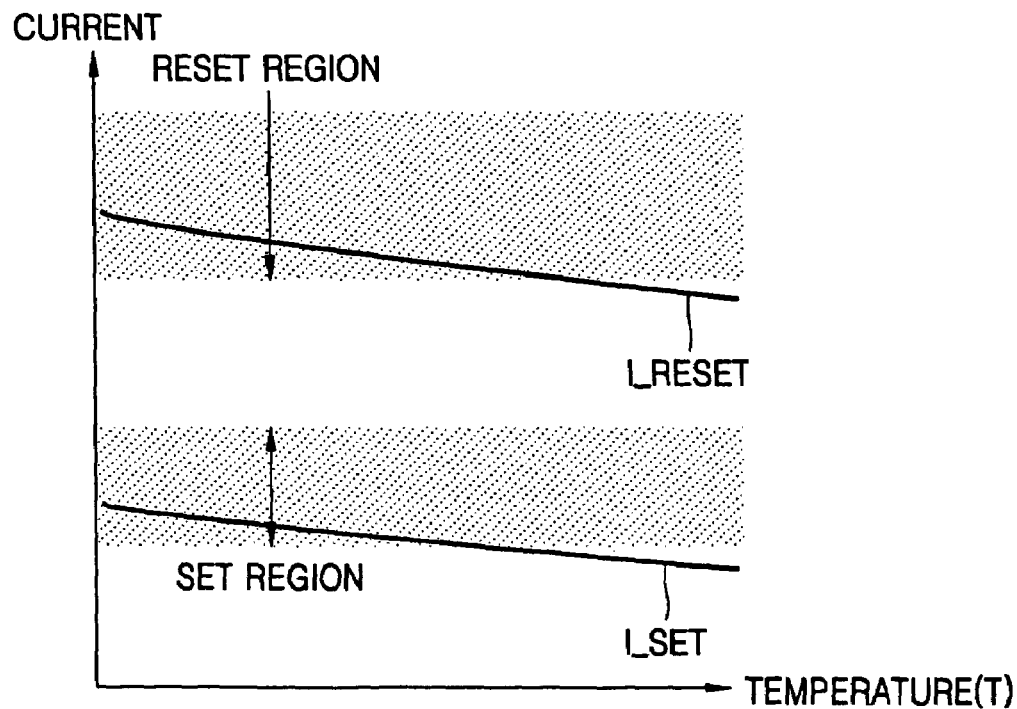
FIG. 2A is a graph illustrating variations in write currents according to the ambient temperature.
Figure 2B:
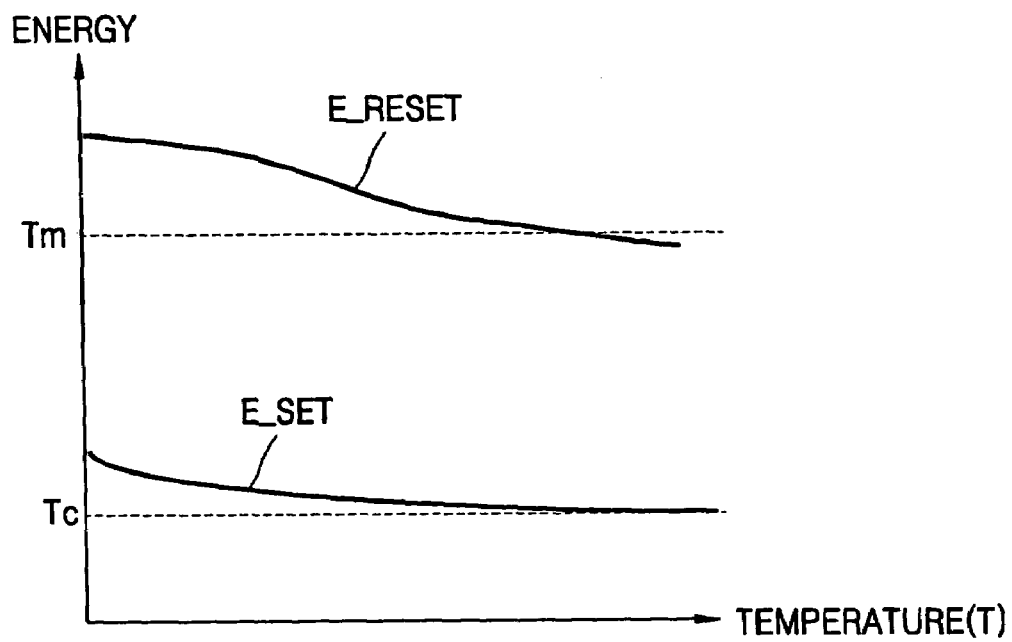
FIG. 2B is a graph illustrating variations in energy in a phase change material (PCM) according to the ambient temperature.

Application of the data DATA at a first (high) level may cause the third transistor TR3 to be turned on and the reset current I_RESET to be output from the second transistor TR2. However, if the ambient temperature increases, the performances of the transistors TR1 and TR2 of the current driver unit 610 may deteriorate, and as a result, the amount of the reset current I_RESET output from the transistors TR1 and TR2 may decrease as indicated with reference to FIG. 2A.

The write driver circuit 600 may further include the positive controller 630. The positive controller 630 may increase the amount of the reset current I_RESET or the set current I_SET in response to the positive control signal PTEM.

The positive controller 630 may include a sixth transistor TR6 including a first terminal connected to the first node N1, a gate to which the positive control signal PTEM is applied, and a second terminal connected to the second node N2. As shown in FIG. 7, the positive control signal PTEM may be a voltage signal whose voltage level increases when that the ambient temperature increases.

When the performances of the transistors TR1 and TR2 is degraded due to an increase in the ambient temperature, the positive control signal PTEM may turn on the sixth transistor TR6 and a voltage level of the first node N1 may decrease.

If the ambient temperature continues to increase, the voltage level of the positive control signal PTEM may also continues to increase and the voltage level of the first node N1 may decrease. In this case, the amount of the reset current I_RESET output from the second transistor TR2 increases.

The write drive circuit 600 may further include a thermal compensator 650 that generates the positive control signal PTEM in accordance with the ambient temperature. As an example, the thermal compensator 650 may use a band gap reference circuit.

The band gap reference circuit may sense the ambient temperature, and output a signal whose voltage level increases and a signal whose voltage level decreases when the ambient temperature increases. Band gap reference circuits are well known to those skilled in the art and a detailed description thereof will be omitted.

The positive control signal PTEM generated by the thermal compensator 650 may increase the amount of the reset current I_RESET when the ambient temperature increases. As illustrated in FIG. 4B, it is possible to maintain thermal energy for the phase of the PCM regardless of the ambient temperature by controlling the amount of the reset current I_RESET according to the ambient temperature.

The resistivity of the PCM may also be maintained regardless of the ambient temperature. In example embodiments above, generation of the reset current I_RESET when the data DATA is at a high level is described for convenience, but the set current I_SET may also be generated using the same techniques as when generating the reset current I_RESET, using the write drive circuit 600. Therefore, generation of the set current I_SET will not be described.

Figure 8:
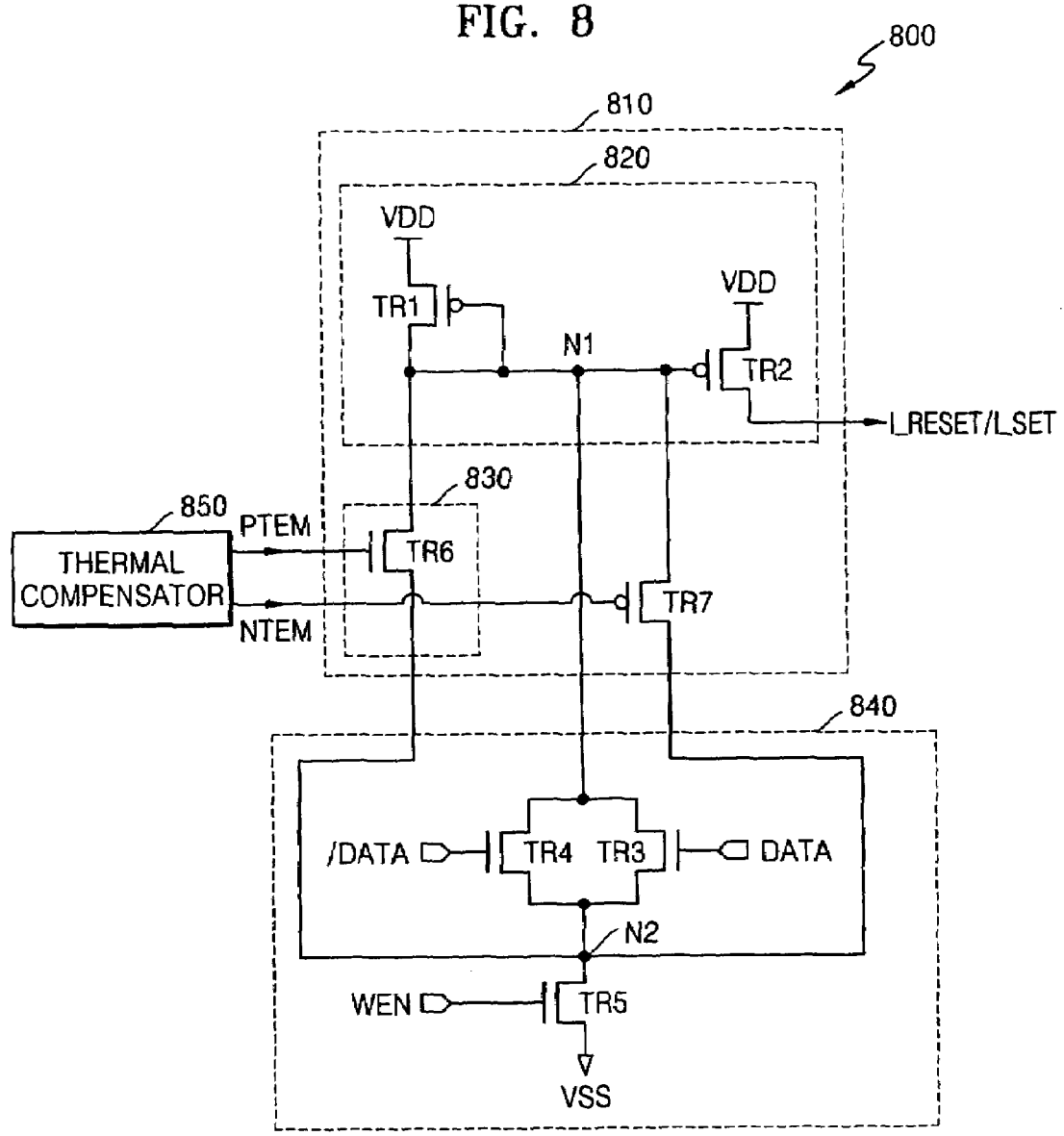
FIG. 8 is a circuit diagram of a write driver circuit using a negative control signal according to an exemplary embodiment of the present invention.

FIG. 8 is an example circuit diagram of a-write driver circuit 800 using a negative control signal NTEM. Referring to FIG. 8, compared to the write driver circuit 600, the write driver circuit 800 may further include a seventh transistor TR7 that is controlled by the negative control signal NTEM. More specifically, a current driver unit 810 of the write driver circuit 800 may further includes the seventh transistor TR7 having a first terminal connected to a first node N1, a gate to which the negative control signal NTEM is applied, and a second terminal connected to a second node N2.

The negative control signal NTEM may be a voltage signal whose voltage level decreases when the ambient temperature increases. The negative control signal NTEM may be output from a thermal compensator 850.

The seventh transistor TR7 may be a PMOS transistor that reduces a voltage level of the first node N1 in response to the negative control signal NTEM when the ambient temperature increases. For this reason, the amount of a current output from a second transistor TR2 may increase when the ambient temperature increases.

Also, regardless of the ambient temperature, thermal energy for changing the phase of the PCM can be maintained as shown in FIG. 4B and/or the resistivity of the PCM can be maintained as shown in FIG. 3.

As described above, a programming method and a write driver circuit of a PRAM according to exemplary embodiments of the present invention may increase the amount of a write current applied to a PRAM cell when the ambient temperature increases. Accordingly, it is possible to maintain a ratio of a reset resistance to a set resistance and maintain a sufficient sensing margin during a read operation.

Although exemplary embodiments of the present invention have been described as utilizing a 'high' logic state, and a 'low' logic state, it will be understood that any logic state may be utilized as may be desired by one of ordinary skill in the art.

Although exemplary embodiments of the present invention have been described with specific circuits implementations, it will be known that any other implementations may also be used as desired by one of ordinary skill in the art.

In an example embodiment, the PCM may include at least one of sulfur (S), selenium (Se), and tellurium (Te). In an example embodiment, the PCM may include at least one chalcogenide. In an example embodiment, the PCM may be of at least one Group VB element, including tantalum (Ta), niobium (Nb), and vanadium (V) and antimony-tellurium (Sb—Te), or at least one a Group VIB element including tungsten (W), molybdenum (Mo) and chromium (Cr) and antimony-selenium (Sb—Se). In an example embodiment, the PCM may include germanium-antimony-tellurium (GST). In an example embodiment, the PCM further includes at least one impurity. In an example embodiment, the at least one impurity may be nitrogen.

While exemplary embodiments of the present invention have been particularly shown and described with reference to embodiments thereof, it will be understood by those skilled in the art that various changes in form and details may be made therein without departing from the spirit and scope of the invention as defined by the appended claims.

What is claimed is:

1. A write driver circuit included in a variable resistive memory which uses a phase change material (PCM) that changes into a higher resistance state or a lower resistance state in response to a current pulse, the write driver circuit comprising:
   a current controller unit which controls the generation of a reset current in response to a write active signal, and data or inversed data; and
   a current driver unit which is controlled by the current controller unit to generate the reset current and changes the reset current in response to a control signal.

2. The write driver circuit of claim 1, wherein the control signal is a positive control signal, the positive control signal being a voltage signal whose voltage level increases when the ambient temperature increases.

3. The write driver circuit of claim 1, wherein the current driver unit comprises:
   a current mirror unit which outputs the reset current; and
   a positive controller which increases the amount of the reset current in response to a positive control signal.

4. The write driver circuit of claim 3, wherein the current mirror unit comprises:
   a first transistor having a first terminal connected to a line voltage, and a gate and a second terminal which are connected to a first node; and
   a second transistor having a first terminal connected to the line voltage, a gate connected to the first node, and a second terminal which outputs the reset current.

5. The write driver circuit of claim 4, wherein the current controller unit comprises:
   a third transistor having a first terminal connected to the first node, a gate to which the data is applied, and a second terminal connected to a second node;
   a fourth transistor having a first terminal connected to the first node, a gate to which the inversed data is applied, and a second terminal connected to the second node; and
   a fifth transistor having a first terminal connected to the second node, a gate to which the write active signal is applied, and a second terminal connected to a ground voltage.

6. The write driver circuit of claim 5, wherein the positive controller is a sixth transistor having a first terminal connected to the first node, a gate to which the positive control signal is applied, and a second terminal connected to the second node.

7. The write driver circuit of claim 6, wherein the current driver unit further comprises a seventh transistor having a first terminal connected to the first node, a gate to which a negative control signal is applied, and a second terminal connected to the second node.

8. The write driver circuit of claim 7 wherein the negative control signal is a voltage signal whose voltage level decreases when the ambient temperature increases.

9. The write driver circuit of claim 8, further comprising a thermal compensator which generates the positive control signal and the negative control signal according to the ambient temperature.

10. The writer driver circuit of claim 9, wherein the thermal compensator includes a band gap reference circuit.

11. A variable resistive memory which uses a phase change material (PCM) that changes into a higher resistance state or a lower resistance state in response to a current pulse, comprising:
    a thermal compensator which generates a control signal according to the ambient temperature; and
    a writer driver connected to the thermal compensator to generate a reset current and change the reset current in response to the control signal.

* * * * *